(12) United States Patent
Wolfson et al.

(10) Patent No.: US 11,675,612 B2
(45) Date of Patent: *Jun. 13, 2023

(54) ACHIEVING NEAR-ZERO ADDED LATENCY FOR MODERN ANY POINT IN TIME VM REPLICATION

(71) Applicant: EMC IP Holding Company LLC, Hopkinton, MA (US)

(72) Inventors: Kfir Wolfson, Beer Sheva (IL); Itay Azaria, Dimona (IL); Jehuda Shemer, Kfar Saba (IL); Saar Cohen, Mishmeret (IL)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 557 days.

This patent is subject to a terminal disclaimer.

(21) Appl. No.: 16/803,626

(22) Filed: Feb. 27, 2020

(65) Prior Publication Data

US 2021/0271503 A1 Sep. 2, 2021

(51) Int. Cl.
| | |
|---|---|
| *G06F 9/455* | (2018.01) |
| *G11C 7/10* | (2006.01) |
| *G06F 11/14* | (2006.01) |
| *G06F 12/02* | (2006.01) |

(52) U.S. Cl.
CPC ...... *G06F 9/45558* (2013.01); *G06F 11/1464* (2013.01); *G06F 11/1471* (2013.01); *G06F 12/0238* (2013.01); *G11C 7/10* (2013.01); *G06F 2009/4557* (2013.01); *G06F 2009/45575* (2013.01); *G06F 2009/45579* (2013.01)

(58) Field of Classification Search
CPC ............. G06F 9/45558; G06F 11/1464; G06F 11/1471; G06F 12/0238; G06F 2009/4557; G06F 2009/45575; G06F 2009/45579; G11C 7/10

See application file for complete search history.

(56) References Cited

U.S. PATENT DOCUMENTS

| | | |
|---|---|---|
| 6,970,987 B1 | 11/2005 | Ji et al. |
| 8,429,362 B1 | 4/2013 | Natanzon et al. |
| 8,478,955 B1 | 7/2013 | Natanzon et al. |
| 8,527,990 B1 * | 9/2013 | Marathe ............... G06F 9/4856 718/1 |
| 8,600,945 B1 * | 12/2013 | Natanzon ............ G06F 11/2064 707/648 |
| 8,806,161 B1 * | 8/2014 | Natanzon ............. G06F 16/184 714/6.32 |
| 10,108,507 B1 | 10/2018 | Natanzon |
| 10,191,687 B1 | 1/2019 | Baruch et al. |
| 2016/0342486 A1 | 11/2016 | Kedem et al. |

* cited by examiner

*Primary Examiner* — Wissam Rashid
(74) *Attorney, Agent, or Firm* — Workman Nydegger

(57) ABSTRACT

One example method includes intercepting an IO issued by an application of a VM, the IO including IO data and IO metadata, storing the IO data in an IO buffer, writing the IO metadata and a pointer, but not the IO data, to a splitter journal in memory, wherein the pointer points to the IO data in the IO buffer, forwarding the IO to storage, and asynchronous with operations occurring along an IO path between the application and storage, evacuating the splitter journal by sending the IO data and the IO metadata from the splitter journal to a replication site.

20 Claims, 5 Drawing Sheets

ACHIEVING NEAR-ZERO ADDED LATENCY FOR MODERN ANY POINT IN TIME VM REPLICATION

RELATED APPLICATIONS

This application is related to U.S. patent application Ser. No. 16/803,630, entitled ACHIEVING NEAR-ZERO ADDED LATENCY FOR ANY POINT IN TIME OS KERNEL-BASED APPLICATION REPLICATION, filed the same day herewith. The aforementioned applications are incorporated herein in their respective entireties by this reference.

FIELD OF THE INVENTION

Embodiments of the present invention generally relate to data replication. More particularly, at least some embodiments of the invention relate to systems, hardware, software, computer-readable media, and methods for reducing latency in data replication processes.

BACKGROUND

Many replication solutions incur Input/Output operation (IO) latency on the protected machine. This is due to the requirement to intercept each IO and synchronously send the IO over the network to a replication appliance as part of the IO path. For example, write IO latency is the round-trip-time (RTT) between an IO intercepting software, such as a splitter, and a replication appliance (RPA). This RTT is typically a few hundreds of microseconds, which is on the same order of magnitude for spindle disks accessed over SAN/iSCSI, or even slow SSDs. In fact, circumstances have arisen in which communication speeds, such as along IO paths, are not keeping pace with memory and storage write speeds. Correspondingly, latency in communications is becoming increasingly problematic. Because typical PIT approaches involve often significant latency, users may attempt to avoid the problem by deciding not to replicate high performance applications so as to avoid a performance hit, even if such applications are mission critical. Write IO latency may be a concern both in physical computing devices and in virtual machines (VMs).

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

DETAILED DESCRIPTION OF SOME EXAMPLE EMBODIMENTS

Figure 1:
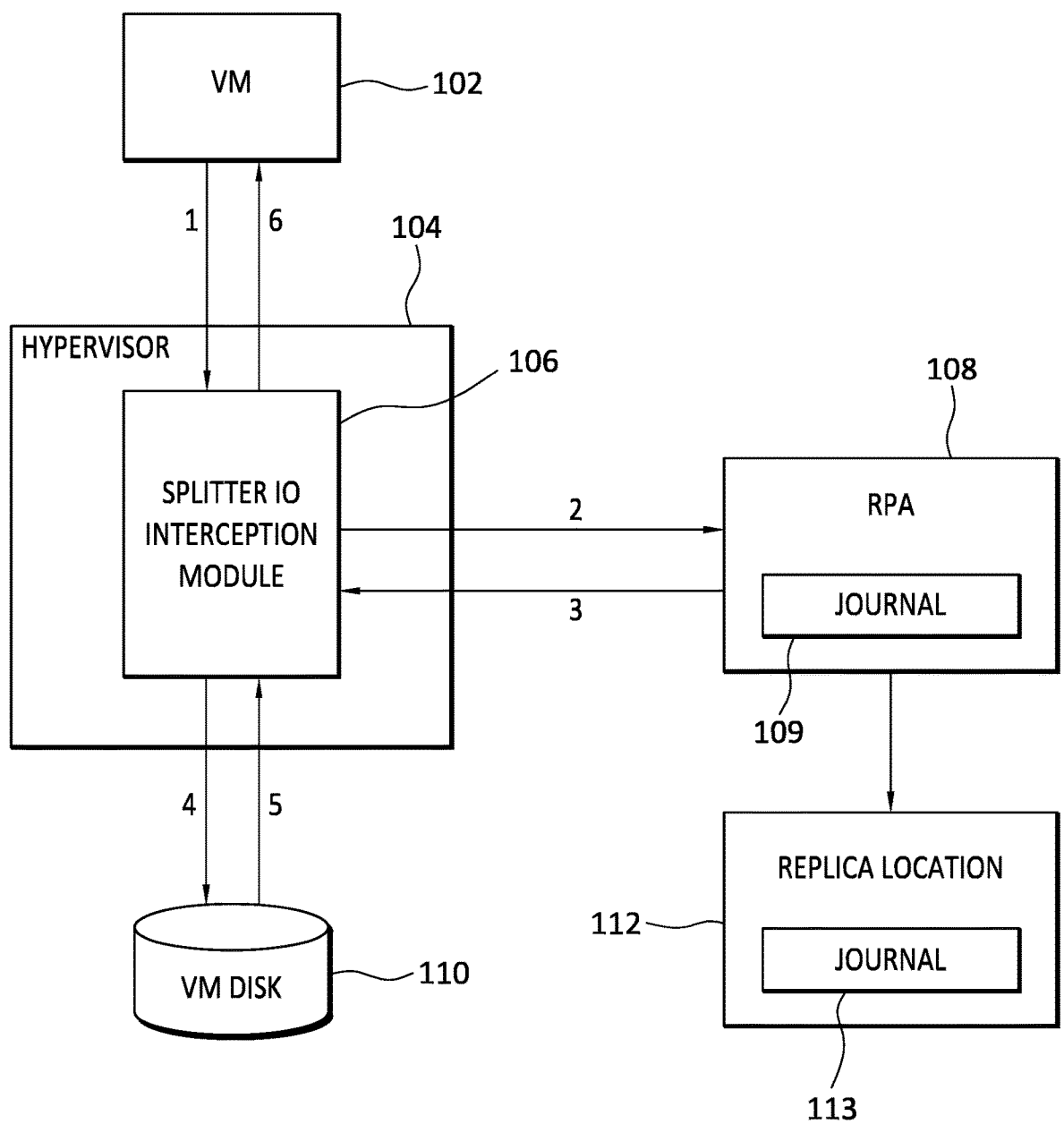
FIG. 1 discloses aspects of a comparative example for illustration purposes.

Embodiments of the present invention generally relate to data replication. More particularly, at least some embodiments of the invention relate to systems, hardware, software, computer-readable media, and methods for reducing latency in data replication processes.

In general, example embodiments of the invention concern the reduction of latency that may be associated with IO processes involving a VM. More particularly, example embodiments of the invention embrace approaches that may eliminate added IO latency for a protected VM machine, while maintaining any-point-in-time restore capabilities. In the Related Application, IO latency between an application of a protected machine and storage was reduced by intercepting application IOs and copying IO data and IO metadata to NVM, and asynchronously transmitting the IOs to a replication site.

In some circumstances, involving VMs for example, the process of copying IO data to NVM may be eliminated, thus reducing latency even further. To this end, example embodiments may provide for a splitter that writes, to a splitter journal in a hypervisor, only (i) the metadata of the IO, and (ii) a pointer to the IO data. The pointer points to the IO data residing in an IO data buffer in VM memory, which may be referred to herein as a VM IO buffer. Thus, such embodiments avoid copying IO data from the IO data buffer to the splitter journal. Because the collective size of the IO metadata and pointer may be measured in bytes, the write process may take only a few nanoseconds, and thereby impose no significant amount of latency on a write IO.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

In particular, one advantageous aspect of at least some embodiments of the invention is that copying of IO data from an IO data buffer to a splitter journal, that is, a mem-copy operation, may be avoided. In an embodiment, latency associated with a write IO may be reduced by writing only IO metadata and a pointer to a splitter journal. An embodiment of the invention may help to maintain write order fidelity even when an associated VM moves from one host to another host. An embodiment of the invention may enable a VM to recover after a crash or other unplanned event by persistently saving the splitter journal in NVM, and thus avoiding the need for a full sweep after a crash.

A. Aspects of an Example Operating Environment and Processes

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, replication operations and operations related to replication.

New and/or modified data collected and/or generated in connection with some embodiments, may be stored in a data protection environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service read, write, delete, backup, restore, and/or cloning, operations initiated by one or more clients or other elements of the operating environment. Where a backup comprises groups of data with different respective characteristics, that data may be allocated, and stored, to different respective targets in the storage environment, where the targets each correspond to a data group having one or more particular characteristics.

Example cloud computing environments, which may or may not be public, include storage environments that may provide data protection functionality for one or more clients. Another example of a cloud computing environment is one in which processing and other services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

In addition to the cloud environment, the operating environment may also include one or more clients that are capable of collecting, modifying, and creating, data. As such, a particular client may employ, or otherwise be associated with, one or more instances of each of one or more applications that perform such operations with respect to data.

In addition to the cloud environment, the operating environment may also include one or more clients that are capable of collecting, modifying, and creating, data. As such, a particular client may employ, or otherwise be associated with, one or more instances of each of one or more applications that perform such operations with respect to data. Such clients may comprise physical machines, or virtual machines (VM)

Particularly, devices in the operating environment may take the form of software, physical machines, or VMs, or any combination of these, though no particular device implementation or configuration is required for any embodiment. Similarly, data protection system components such as databases, storage servers, storage volumes (LUNs), storage disks, replication services, backup servers, restore servers, backup clients, and restore clients, for example, may likewise take the form of software, physical machines or virtual machines (VM), though no particular component implementation is required for any embodiment. Where VMs are employed, a hypervisor or other virtual machine monitor (VMM) may be employed to create and control the VMs. The term VM embraces, but is not limited to, any virtualization, emulation, or other representation, of one or more computing system elements, such as computing system hardware. A VM may be based on one or more computer architectures, and provides the functionality of a physical computer. A VM implementation may comprise, or at least involve the use of, hardware and/or software. An image of a VM may take the form of a .VMX file and one or more .VMDK files (VM hard disks) for example.

As used herein, the term 'data' is intended to be broad in scope. Thus, that term embraces, by way of example and not limitation, data segments such as may be produced by data stream segmentation processes, data chunks, data blocks, atomic data, emails, objects of any type, files of any type including media files, word processing files, spreadsheet files, and database files, as well as contacts, directories, sub-directories, volumes, and any group of one or more of the foregoing.

Example embodiments of the invention are applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

As used herein, the term 'backup' is intended to be broad in scope. As such, example backups in connection with which embodiments of the invention may be employed include, but are not limited to, full backups, partial backups, clones, snapshots, and incremental or differential backups.

B. Aspects of a Comparative Example

With particular attention first to FIG. 1, a brief overview is provided by way of a comparative example that will aid in the illustration of various concepts within the scope of the invention. In general, embodiments of the invention may be employed in connection with native VM replication processes.

In the comparative example of FIG. 1, an example operating environment may include a VM 102 that hosts one or more applications (not shown) which write IOs. The VM 102 may communicate with a hypervisor 104 that includes a splitter IO interception module 106. As well, the hypervisor 104, particularly the splitter IO interception module 106, may communicate with a recovery module 108, such as the Dell-EMC RecoverPoint replication platform for example. Finally, the hypervisor 104, particularly the splitter IO interception module 106, may also communicate with a storage environment 110, which may take the form of one or more VM disks.

In this comparative example, a VM replication flow, implemented by the splitter IO interception module 106, might proceed as follows:
1. Intercept Write IO;
2. Send copy of IO to the RPA;
3. Ack (acknowledgement) from RPA;
4. Send IO to the storage;
5. Ack (acknowledgement) from storage; and
6. Ack (acknowledge) the IO to the application.

The RPA 108 may keep a journal 109 of incoming IOs, and will send the intercepted IOs asynchronously to a replica location 112 where they can be saved in an Any-PIT Journal 113. In this example, significant latency may be added by certain aspects of the replication flow, such as 2 Send copy of IO to the RPA. The process 2 may add several hundred microseconds to the overall replication flow. This is because the splitter IO interception module 106 would copy the incoming IO, and then send the IO copy to the RPA. Further, communication processes such as 2 and 3 may be significantly slower than VM disk processes such as processes 4 and 5.

Thus, in the comparative example of FIG. 1, the latency introduced by process 2, for example, would adversely impact hi-performance applications such as those hosted by the VM 102, which are connected to high-end storages with ultra-low latency, such as the storage environment 110. Correspondingly, the storage environment 110 may not realize its full potential, since the communication latency of process 2 for example may significantly undercut the benefit provided by high speed storage. This may be of particular concern in view of the fact that the latency incurred by storage continues to drop. For example, some NVMe and SSDs have dropped below 100 μs latency.

C. Aspects of Some Example Embodiments

At least some embodiments of the invention involve the use of non-volatile memory (NVM) in a protected machine. A variety of different NVM technologies may be employed in example embodiments including, but not limited to, Storage Class Memory (SCM). In some embodiments, NVM may be employed that takes the form of persistent memory installed inside the protected machine, with a very low latency (such as about 1-10 μsec), and relatively low cost. NVMs may be configured either as another disk, or a cache layer for the storage such as Dell EMC VxFlex, or as memory-addressable, and thus not accessed using storage/IO constructs. As used herein, NVM also embraces Non-Volatile Random Access Memory (NVRAM), and Non-Volatile Dual In-line Memory Modules (NVDIMM). Other DIMMS may include, for example, NAND+DRAM DIMMS and XP DIMMs/ReRAM. Other NVMs that may be employed in some embodiments include Fast NAND SSDs, and 3D XP SSD. However, the scope of the invention is not limited to the use of any particular type of NVM. Thus, the foregoing are presented only by way of example, and are not intended to limit the scope of the invention in any way. Following is a discussion of some aspects of example embodiments of the invention.

Figure 2:
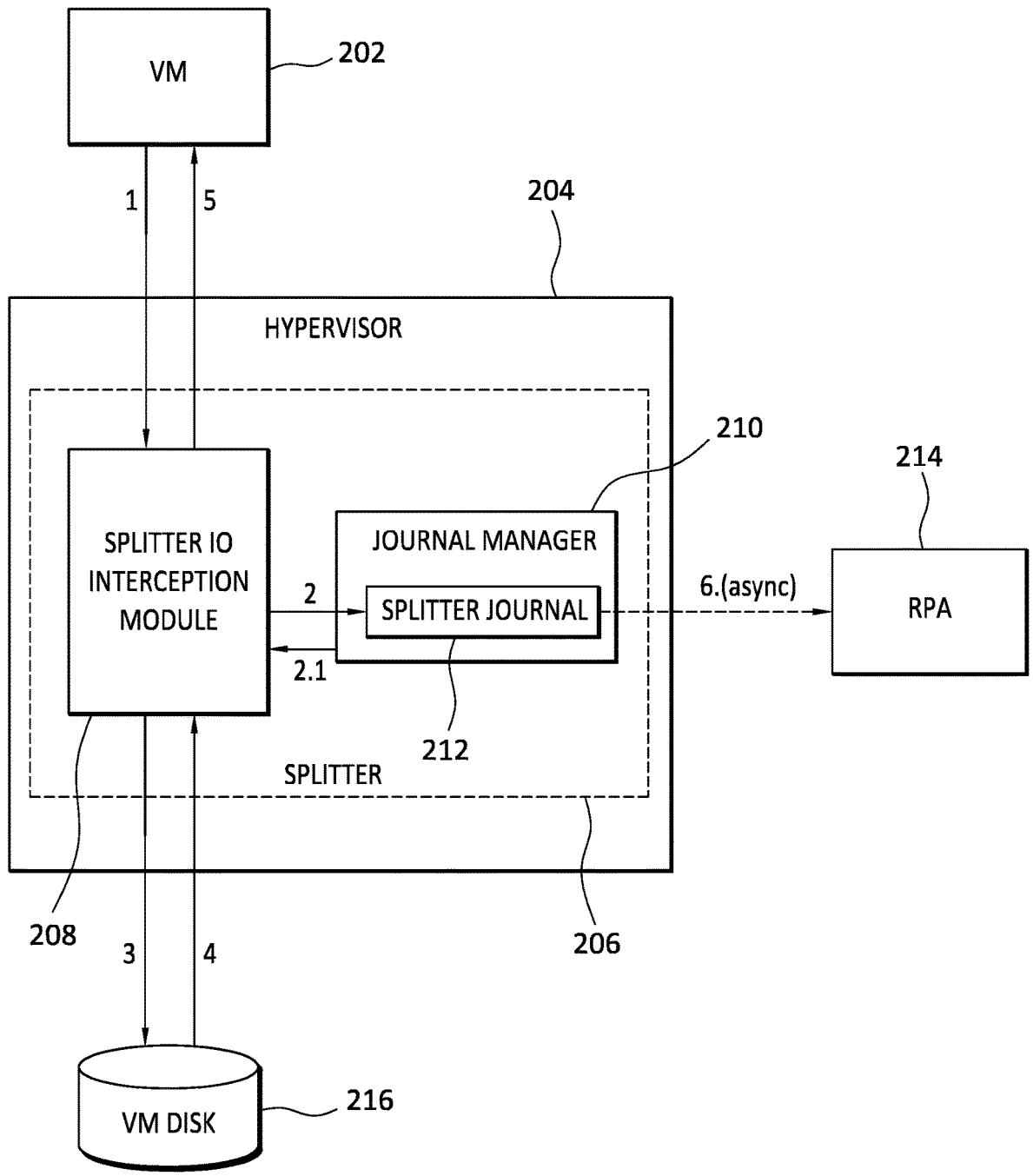
FIG. 2 discloses aspects of an example architecture and IO flow.

With reference now to FIG. 2, aspects of some example embodiments are discussed. In the example of FIG. 2, the operating environment may include a one or more protected machines, such as a VM 202 that hosts one or more applications (not shown) which write IOs. A hypervisor 204, which may communicate with, and control, the VM 202, may include a splitter 206 that comprises a splitter IO interception module 208, and a journal manager 210 that may include one or more splitter journals 212 that may communicate with a replication module 214. The journal manager 210 may reside on memory-accessed NVM, or storage-accessed NVMe, associated with the hypervisor 204. Finally, the splitter 206 may communicate with the storage 216, which may comprise one or more VM disks. Communication between the splitter 206 and the replication module 214 may take asynchronously relative to IO operations involving any one or more of the VM 202, hypervisor 204, and storage 216.

In some embodiments, one splitter journal 212 is provided for a consistency group, so that disks of the consistency group can be maintained in a consistent state with respect to each other. That is, the protected machine 202 may have multiple disks that may need to be maintained in a consistent state with each other. In the case of a physical machine, there may only be one splitter journal 212 for that machine. Where the protected machine 202 is a VM however, the hypervisor 204 may include multiple splitter journals 212.

With continued reference to FIG. 2, following is an example VM replication flow that may be implemented by the splitter IO interception module 208 in connection with other components of the example operating environment:
 1. Intercept Write IO (IO data is temporarily stored in an IO data buffer);
 2. Send copy of IO metadata and pointer to the IO data in the IO data buffer;
 3. Send IO to the storage;
 4. Ack (acknowledgement) from storage;
 5. Ack (acknowledge) the IO to the application
 6. Outside of the main IO flow, send the splitter journal IOs to the replication module asynchronously.

As can be seen from FIG. 2, and with reference to the comparative example of FIG. 1, the latency of a round-trip to the recovery module 214, processes 2 and 3 in FIG. 1, has been eliminated from the write IO path in the configuration of FIG. 2. Instead, and as discussed below, process 6 of FIG. 2 is performed asynchronously relative to processes 1, 3, 4 and 5, of FIG. 2, with the result that process 6 does not impose any latency on the write IO path 1 and 3 between the application of the VM 202 and the storage environment 216. Because, as noted herein with respect to the example of FIG. 1, the latency imposed by processes 2 and 3 in FIG. 1 may be significantly greater than the latency imposed, whether individually or collectively, by the processes 1, 4, 5, and 6 in FIG. 1. Thus, in some embodiments, a significant reduction in IO latency may be obtained by reducing or eliminating the latency associated with communications to/from a replication module 214, such as has been done in the example embodiment of FIG. 2 with respect to replication module 214.

As well, the latency associated with IO operations may be further reduced by retaining the IO data intercepted in process 1 in an IO data buffer (not shown) of the hypervisor 204, rather than copying that IO data to the splitter journal 212. That is, and as noted herein, only the IO metadata, and a pointer to the IO data in the IO data buffer, are stored by process 2 in the splitter journal 212. Because the IO metadata and the pointer are, individually and collectively, relatively small in size, only a very short amount of time is needed to store them in the splitter journal 212. Thus, process 2 may impose little, or no, material latency on an IO process, such as a write IO process, that includes processes 1, 3, 4, and 5.

With continued reference to the example IO flow and configuration of FIG. 2, further details are provided concerning some example embodiments. As noted, in order to reduce latency in native VM replication processes, a memcopy process, inside the hypervisor 204 kernel, in which the IO data is written to a splitter journal may be eliminated. In general, this may be implemented through the use of logic in the VM memory management of the hypervisor OS.

By way of brief introduction, example embodiments may include and employ hypervisor memory, which may be used by the VM 202, that may be allocated in 4K aligned chunks. That is, each 4K chunk of the hypervisor memory may start at a memory address that is divisible by 4K. This may be referred to as an aligned allocation. Embodiments of the invention may also include and employ VM memory, which may be allocated in 4K aligned pages. It is noted that the VM memory may be virtual memory, that is, the VM memory may comprise 4K pages of memory that do not need to be consecutive, and may be referenced by one or more pointers, as discussed below.

In further detail, the VM 202 OS may receive, or be allocated, memory pages by the hypervisor 204. Memory pages may be referred to herein simply as 'pages.' The list of memory pages associated with a particular VM 202 may change, for example, when unused memory pages are replaced. However, the changes to the memory list may not be apparent to the processes of the VM 202. One example of a page manager that manages a list of memory pages is the VMtools utility by VMware.

With continued reference now to pointers as they relate to memory pages, because the pointers point, or refer, to respective pages or chunks, each pointer to a particular page or chunk may be referred to as a reference. The total number of pointers to a particular page or chunk, which can be 0 or any positive integer, may thus be referred to as the refcount for that page or chunk. When a pointer is added to the refcount for a page or chunk, the corresponding refcount is incremented, and when a pointer is removed from the refcount for a page or chunk, the corresponding refcount is decremented.

Thus, when an IO comes in, the system may receive a pointer that points to the IO data in an IO buffer. Rather than copying the IO data from the IO buffer to a journal, for example, the refcount of pages for that IO data is incremented. As a result of incrementing the refcount, the page to which the refcount refers will not be freed at the end of the IO. Note that any non-zero refcount may ensure that the page will be retained.

In more detail, the VM memory refcount and/or the hypervisor memory refcount may be incremented as the result of an incoming IO. The incrementing of these refcounts is made possible because the IO buffer is 4K multiple and aligned, the OS virtual memory in the hypervisor is 4K multiple and aligned, and the VM memory is 4K multiple and aligned. Thus, assurance may be had that all of these memory managers are referring to the same full 4K page(s).

If VM memory refcounts are increased every time an IO comes in, the VM would run out of memory relatively quickly. This is because the refcount is treated as using VM memory. Instead then, rather than increasing the VM memory refcount, embodiments of the invention may simply provide the VM with an additional page from the hypervisor memory. This process may be referred to as page exchange or page swapping. Thus, instead of copying the IO data, that is, performing mem-copy, a pointer points to a page of the IO memory buffer, and the VM memory is provided with another page by the hypervisor. The page of the IO memory buffer may be released after the splitter journal is evacuated. Thus, embodiments of the invention may reduce the latency such that process 2 (FIG. 2) may be just a few nanoseconds, such as about 5 nanoseconds or less for example, and includes only writing the metadata of the IO and the pointer to the data, whose collective size may be measured in byte, in the splitter-journal 212. A near-zero latency includes latencies of about 5 nanoseconds or less.

D. Write Order Fidelity

Figure 3:
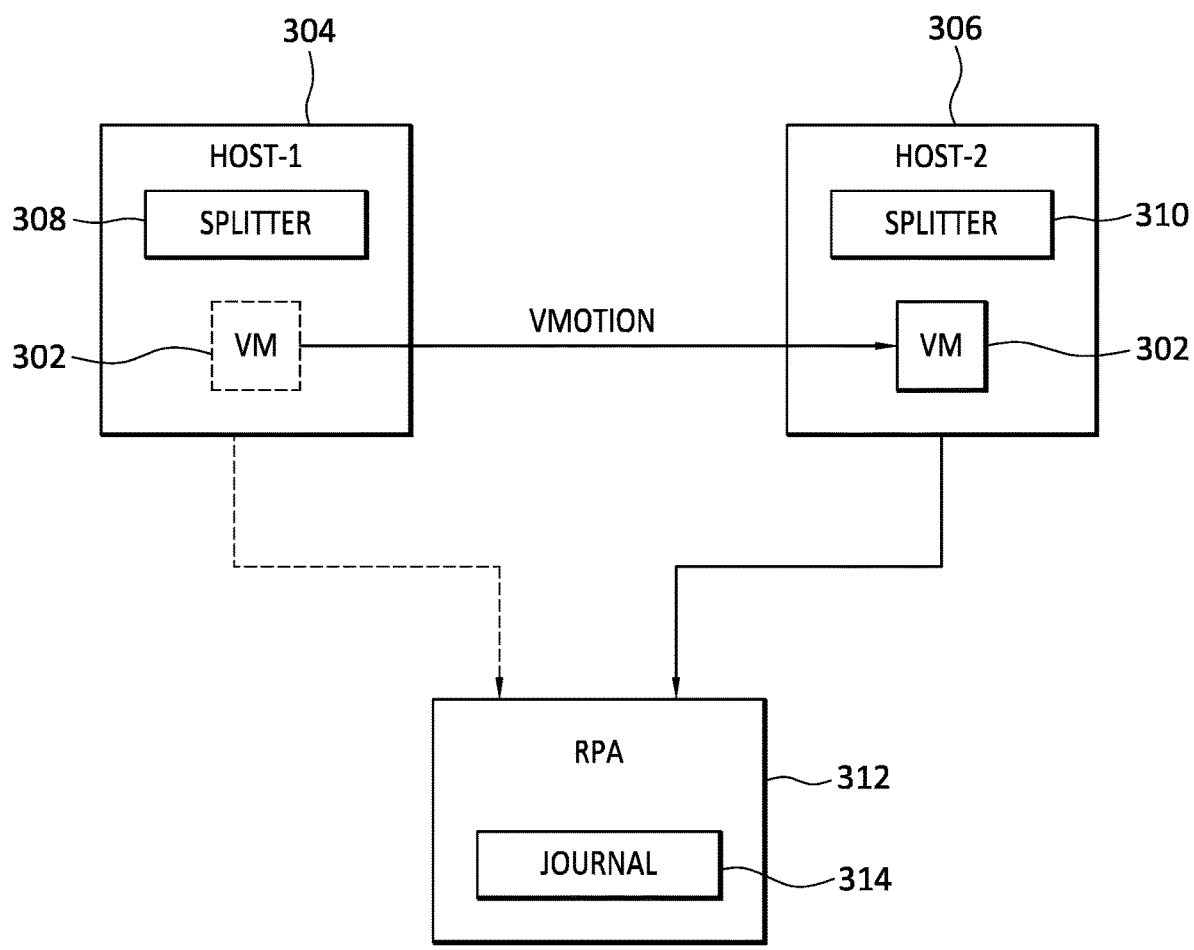
FIG. 3 discloses aspects of a VM migration.

With reference now to FIG. 3, another aspect of some example embodiments is that live migration of a VM between hosts may be accommodated. Such a live migration of a VM between hosts may be effected, for example, by the VMware vMotion platform, although any other software and/or hardware of comparable functionality may be used instead. In order to support vMotion without disrupting the VM replication, and keeping all snapshots consistent, one or more embodiments may include the following feature.

Particularly, after a VM 302 migrates from a host-1 304 to a host-2 306, for example, the respective splitters 308 and 310 on host-1 and host-2 may send their journal portions to the replication module 312, which may be an RPA, in parallel. That is, host-1 304 may send the journal portions of the IOs issued before the VM 302 moved to host-2 306, and after the VM 302 has migrated to the host-2 306, the host-2 306 will start sending new IOs entering its journal. Note that as used herein, a 'host' embraces a hypervisor, such as a VMware ESX hypervisor. A VMware ESX hypervisor may be simply referred to as an ESX host.

To maintain write order fidelity, that is, to make sure that all of the IOs associated with the VM 302, regardless of where it is hosted, are kept in order, the journal 314 of the replication module 312 must maintain the original order of the IOs received from host-1 304 and received from host-2 306. Write order fidelity may be established and maintained in various ways.

For example, the replication module 312 may be configured such that it may not allow journal evacuation from host-2 306 until host-1 304 has finished evacuating the journal pertaining to the VM 302 and has informed the RPA that evacuation of that journal is complete. In the meantime, host-2 splitter 310 may retry evacuating the journal pertaining to the VM 302 until it succeeds. Since the journal evacuation occurs asynchronously with respect to the production IOs, the journal evacuation processes will not affect the production IOs, as long as there is enough memory to keep the journal on host-2 306.

In another approach to establishing and maintaining write order fidelity, the replication module 312 may allow evacuation of the journal of host-2 306 while host-1 304 is still evacuating its journal. In this case, the replication module 312 may save the journal IOs from host-2 306 in a different location, such as on disk for example, until evacuation of host-1 304 splitter journals is finished.

Write order fidelity may also be established and maintained by marking each IO with a "session number," which may be an incrementing number assigned by the replication module 312 on evacuation handshake, that is, when the replication modle 312 establishes communication with the journal of the host. The session number may be based on both (i) a splitter ID, and (ii) VM status information. For example, if a VM migrates between hosts thus 1→2→1, then the replication module 312 may need to know not only the splitter ID but also the fact that the VM has most recently moved from host-2 306 to host-1 304. As such, the assigned session numbers should reflect the fact that even though two sets of IOs from host-1 304 will be evacuated to the replication module 312, those two sets are not processed one after the other at the replication module 312. Rather, to maintain write order fidelity with respect to a VM that has migrated between hosts thus 1→2→1, the processing of the IO sets would be 1—first IO set from host-1 304, 2—IO set from host-2 306, and 3—second IO set from host-1 304. It is noted that while each of the IOs may have an associated timestamp, the use of timestamps may not be a reliable or effective way to establish and maintain write order fidelity of the IOs at the replication module 312, since a clock of the host-1 304 may not be in synch with a clock of host-2 306.

The session number may take various forms, one example of which was discussed above. In another embodiment, the session number may take the form of a splitter ID that is concatenated to a counter. Thus, continuing with the example of a VM that has migrated between hosts thus 1→2→1, the session number for the three IO sets may be as follows: 1-1, 2-2, and 1-3. The first number of each pair identifies the splitter, and the second number of each pair is the incrementing counter number.

Regardless its form, the use of a session number may enable the replication module 312 to finish processing all IOs from a running session before switching to another session. It is noted further that while the discussion of FIG. 3 concerns two hosts, the scope of the invention is not limited to any particular number of hosts. Thus, example embodiments may be extended to any number of hosts that a VM 302 migrates between. In any VM migration scenario however, the IOs may be written to the final replication module journal 314 in order. As discussed below, problems may arise in connection with the migration of a VM from one host to another.

For example, and with continued reference to FIG. 3, in the case of an error scenario such as a relatively long disconnection between host-1 304 and replication module 312, it may be the case that the VM 302 has migrated to host-2 306, such that there are two hosts not evacuating. That is, host-1 304 is not evacuating its journal due to disconnection from the replication module 312, and host-2 306 is not evacuating its journal since the replication module 312 is not allowing host-2 306 evacuation until host-1 304, which is disconnected, signals that it has finished all evacuations. Note that this example scenario assumes the write order fidelity approach in which the destination host, host-2 306, is not permitted by the replication module 312 to evacuate until the source host, host-1 304, has finished evacuation. In conditions such as those just described, all replication IO activity may suspended, with the result that the customer data is not protected during this time. That is, IOs written by the VM 302 are not being replicated, and if the VM 302 were to fail for some reason, those IOs may be lost.

Thus, it may be useful to limit the amount of time that the customer data is unprotected. Because there may be various options available in this regard, a decision may be needed as to what action should be taken, and when. For example, in the long-disconnect scenario outlined, above, the system may decide to wait for a period of time which may be user-selectable, for example about 3 hours after the last IO was received, for further IOs to come in. If connectivity to host-1 304 is restored before the time period expires, the host-1 304 journal evacuation may proceed. On the other hand, if connectivity is not restored within the specified period of time, the system may decide to resynchronize the VM disks, that is, the system may perform a volume-sweep, or full sweep. Performance of a full sweep will empty the host journals and the replication module journal, but will allow processing of IOs to begin again and will enable saving new snapshots.

E. Aspects of Example Disaster Scenarios

Because IOs may be sent from the splitter to a replication module asynchronously with respect to the IO processes, a circumstance may arise in which information about an IO resides on the splitter memory alone, inside the splitter journals, until the journal portion is sent to the RPA. This circumstance may be readily dealt with where an event is expected or planned to occur. For example, in the case of a planned reboot of a host, which may take the form of hypervisor such as an ESX host for example, the splitter of the host may delay the restart of the host until all splitter journal data is evacuated, or saved persistently to disk. Since the host is about to restart and this is a planned restart, the VM or VMs that had run on the host may have already been migrated to another host, or powered off. Thus, there will be no more incoming IOs from the VM(s) that require writing to the splitter journals of the host, and replication to the replication module.

In other circumstances, the restart of the host may occur as a result of an unexpected and unplanned event, such as ESX host crash scenario for example. In circumstances such as these, the replication system may require a resynchronization of all the VM disks, for all protected VMs running on the ESX host. This is a hypervisor-level process and may be referred to as a "full sweep." The full sweep process may take a relatively long time, measured in hours, depending on the size of the disks, the available bandwidth, and other considerations. The reason a full sweep may be required in such circumstances is that the replication system, which must ensure all IOs to the production VM disks are replicated to the replica VM disks, may have lost track of all IOs that were in the splitter journal, which was in memory, and thus lost in the restart. There is also no way of knowing what areas of the disk were written to, so all the disk must be resynced. As discussed below, these problems may be overcome, for example, by saving the splitter journal(s) persistently in NVM.

In particular, one approach involves using NVM to save the splitter journal persistently, while still maintaining low-latency access. Once the splitter journal, such as splitter journal 212 of FIG. 2 for example, is persistent, the splitter 206 will read the splitter journal 212 upon starting, and the evacuation of the splitter journal 212 may continue from the same place where it left off before the splitter 206 was restarted. This approach may be an effective way to deal with, at least, the unexpected restarts scenario described above.

The NVM used for the splitter journal may be memory-accessed or storage-accessed. Where memory-accessed NVM, such as NVRAM for example, is used, the IO flow may be similar, or identical, to what is indicated in FIG. 2. Further, to continue using the memory-manager method to avoid the need to perform the memcpy process, the whole VM memory may be required to reside in NVM, so this approach may only be used only for latency-sensitive apps of the VM. As used herein, a latency-sensitive application includes applications whose operation may be materially impaired by a latency penalty in the range of about 10 µs to about 100 µs or more.

On the other hand, for apps of the VM that are not latency-sensitive, the hypervisor may be configured to use memcpy to copy the IO data buffer to the splitter-journal. This may add some latency, such as on an order of about 1 µs, but may improve the response of the VM in the case of unexpected restarts. Further, the use of storage-accessed NVM, such as NVMe, would mean, with reference to the example of FIG. 2, that process 2 writes the data to the disk and only after getting an ack, process 2.1, the IO is sent, by process 3, to the production disk at storage 216. Using storage-accessed NVM may also require that the memcpy process be performed.

In case the ESX host or other hypervisor is down, the replication module cannot access the splitter journal information in the NVM, until the host is back up. Until that happens, it may be assumed that the production disk(s) and replication disk(s) are in an inconsistent state with each other. Similar to the case, discussed above, where there has been a relatively long disconnection between a host and associated replication module, a user-modifiable timeout may be set, after the expiration of which the system will resynchronize the disks and thereby return to a consistent state. In such a case, after the ESX does eventually come back up, the splitter journal information on the NVM may be ignored and reset to a clean journal.

As disclosed herein, embodiments of the invention may virtually, or completely, eliminate a latency hit for any-PIT data-protected applications running on a VM. This is a particularly useful feature for latency-sensitive applications running on NVMe and other low-latency VM disks. Embodiments of the invention also provide for processes that deal with VM and hypervisor disaster scenarios, and processes that are able to accommodate the migration of one or more VMs between/among multiple h hosts. Embodiments of the invention may employ processes and memory configurations, such as the use of NVM to persistently store splitter journals, that avoid the need to copy an IO buffer in connection with a replication process. Embodiments of the invention may employ NVM to facilitate resumption of a journal evacuation process from the point at which the evacuation process left off as a result of a splitter restart.

D. Example Methods

Figure 4:
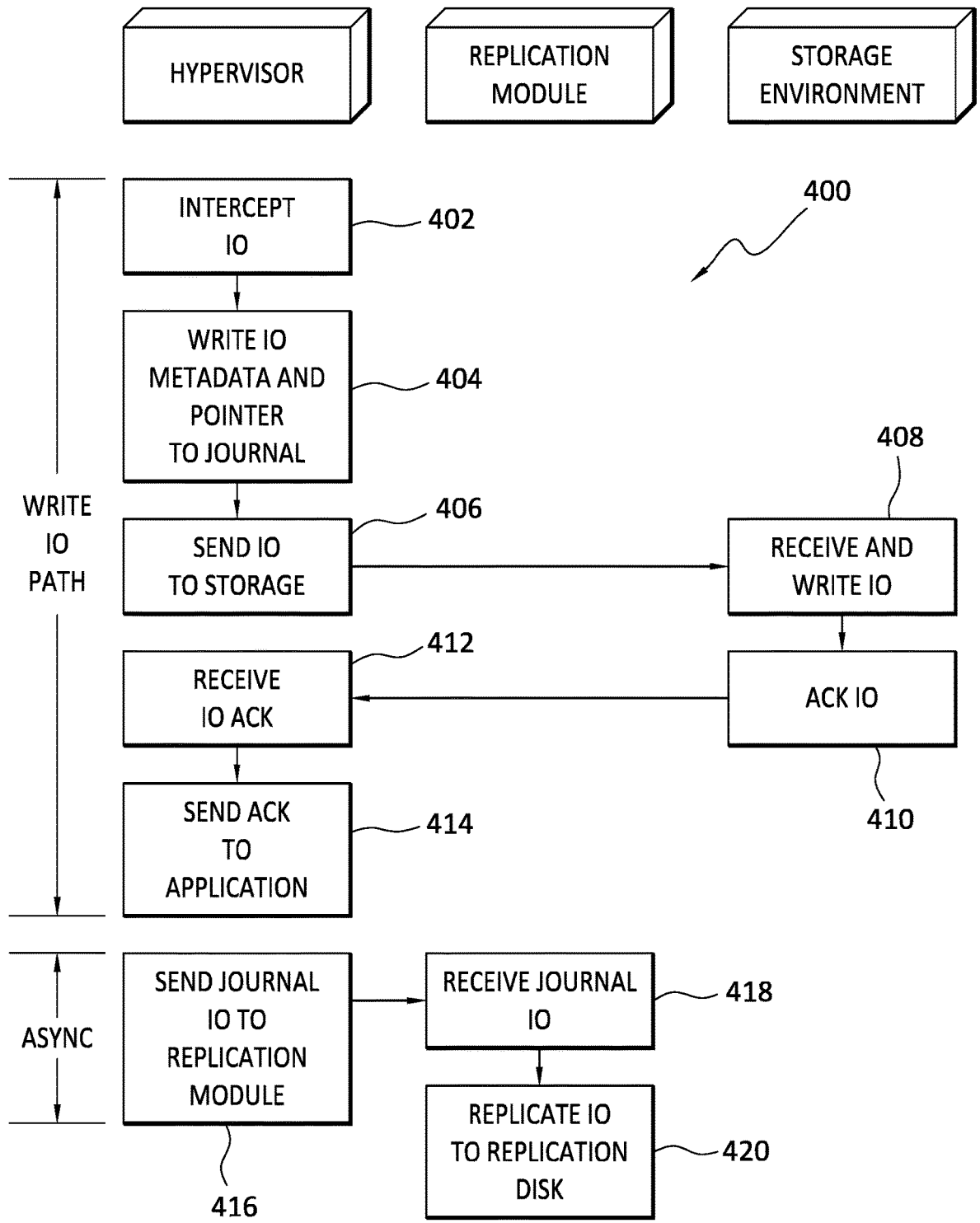
FIG. 4 discloses aspects of an example method.

Directing attention next to FIG. 4, details are provided concerning some methods for replicating the data of a protected machine, such as VM for example, without imposing latency, such as write IO latency, on an IO path between an application of a protected machine and a storage environment. One example of such a method is denoted generally at 400. Example embodiments of the method may involve operations of a protected machine, replication module, and storage environment. Other embodiments may employ additional, or alternative, components however, and the scope of the invention is not limited to the aforementioned example embodiments.

Initially, an application, which may be a latency-sensitive application that resides on or is hosted by a production machine such as a VM that is protected by a replication process, issues an IO, such as a write IO for example. The method 400 may begin when the IO is intercepted 402 by a splitter IO interception module of a hypervisor. A pointer, and IO metadata concerning the IO, such as the identification of the application, and a timestamp, for example, may then be written to a splitter journal 404 on NVM of the hypervisor. In some other embodiments, the splitter journal may reside on a disk, storage, or memory, external to the protected machine. The pointer stored in the splitter journal points to the IO data stored in an IO buffer of the hypervisor. As such, there may be no need to copy the IO data from the IO buffer to the splitter journal. Rather, and as noted, only a pointer to the IO data, and IO metadata, are stored in the splitter journal, and the IO data is not copied from the IO buffer to the splitter journal.

In other embodiments, where the application that issued the IO may not be latency-sensitive, the splitter journal may be stored in storage-accessed NVM. In this case, the IO data, along with the IO metadata, may have to be copied from the IO buffer to the splitter journal, but there would be no need to use or store a pointer.

Because the splitter journal may reside on memory-accessed NVM of a hypervisor, the writing of the IO metadata and pointer to the splitter journal may be a relatively fast process as compared with a process in which the IO data and IO metadata are written to the splitter journal. Thus, the writing of the pointer and IO metadata to the splitter journal may not impose any material latency to the overall write IO path from the application to the storage environment.

After the pointer and IO metadata have been written to the splitter journal 404, the IO data in the IO buffer, and the associated IO metadata, may then be sent 406 by the splitter IO interception module to a storage environment, such as a production storage environment for example. The storage environment may then receive and write 408 the IO data and IO metadata received from the splitter IO interception module. Receipt of the IO data and IO metadata may be acknowledged 410 by the storage environment to the splitter IO interception module, which may receive 412 the acknowledgement. The storage of the IO data and the IO metadata at the replication site may then be acknowledged 414 by the splitter IO interception module to the application that issued the IO.

At any time after the pointer and IO metadata are written to the splitter journal 404, the pointer and IO metadata written at 404 to the splitter journal may be evacuated 416, either individually or in batches, to the replication module. As part of, or separate from, the evacuation 416, the IO data in the IO buffer may be transmitted 416 to the replication module. As part of the evacuation 416, or separately, the pointer corresponding to the IO data transmitted to the replication module may be flushed from the splitter journal. The IO data in the IO buffer may be transmitted to the replication module before, during, or after, the evacuation. The replication module may then receive 418 the IO data and IO metadata, and replicate the IO data and IO metadata 420 to a replication disk.

E. Further Example Embodiments

Following are some further example embodiments of the invention. These are presented only by way of example and are not intended to limit the scope of the invention in any way.

Embodiment 1. A method, comprising: intercepting an IO issued by an application of a VM, the IO including IO data and IO metadata; storing the IO data in an IO buffer; writing the IO metadata and a pointer, but not the IO data, to a splitter journal in memory, wherein the pointer points to the IO data in the IO buffer; forwarding the IO to storage; and asynchronous with operations occurring along an IO path between the application and storage, evacuating the splitter journal by sending the IO metadata and the IO data from the splitter journal to a replication site.

Embodiment 2. The method as recited in embodiment 1, wherein writing the pointer and IO metadata to the splitter journal site does not increase a latency associated with the operations between the application and storage.

Embodiment 3. The method as recited in any of embodiments 1-2, further comprising, asynchronous with operations occurring along an IO path between the application and storage, sending the IO data from the IO buffer to the replication site.

Embodiment 4. The method as recited in any of embodiments 1-3, further comprising maintaining write order fidelity of incoming IOs from the VM as the VM migrates from a first host to a second host, and maintaining write order fidelity comprises marking each incoming IO with a session number.

Embodiment 5. The method as recited in any of embodiments 1-4, further comprising receiving IOs from two different hosts as the VM migrates from one of the hosts to the other host, and maintaining write order fidelity of the IOs.

Embodiment 6. The method as recited in any of embodiments 1-5, further comprising experiencing a crash of the VM and, after restart of the VM, resuming evacuation of the splitter journal at a point where evacuation had previously ceased due to the crash of the VM.

Embodiment 7. The method as recited in any of embodiments 1-6, wherein after replication of IOs to the replication site has been suspended due to a lack of communication between the VM and the replication site, the method further comprises either: resynchronizing a replication disk with a disk of the VM if communication between the VM and the replication site does not resume within a user-specified time period; or if communication between the VM and the replication site resumes within the user-specified time period, recommencing splitter journal evacuation.

Embodiment 8. The method as recited in any of embodiments 1-7, wherein the memory comprises NVM.

Embodiment 9. The method as recited in any of embodiments 1-8, wherein part of the method is performed inside a hypervisor kernel.

Embodiment 10. The method as recited in any of embodiments 1-9, wherein the IO path comprises a path between the application and a splitter, and a path between the splitter and the storage.

Embodiment 11. A method for performing any of the operations, methods, or processes, or any portion of any of these, disclosed herein.

Embodiment 12. A non-transitory storage medium having stored therein instructions that are executable by one or more hardware processors to perform the operations of any one or more of embodiments 1 through 11.

F. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 5:
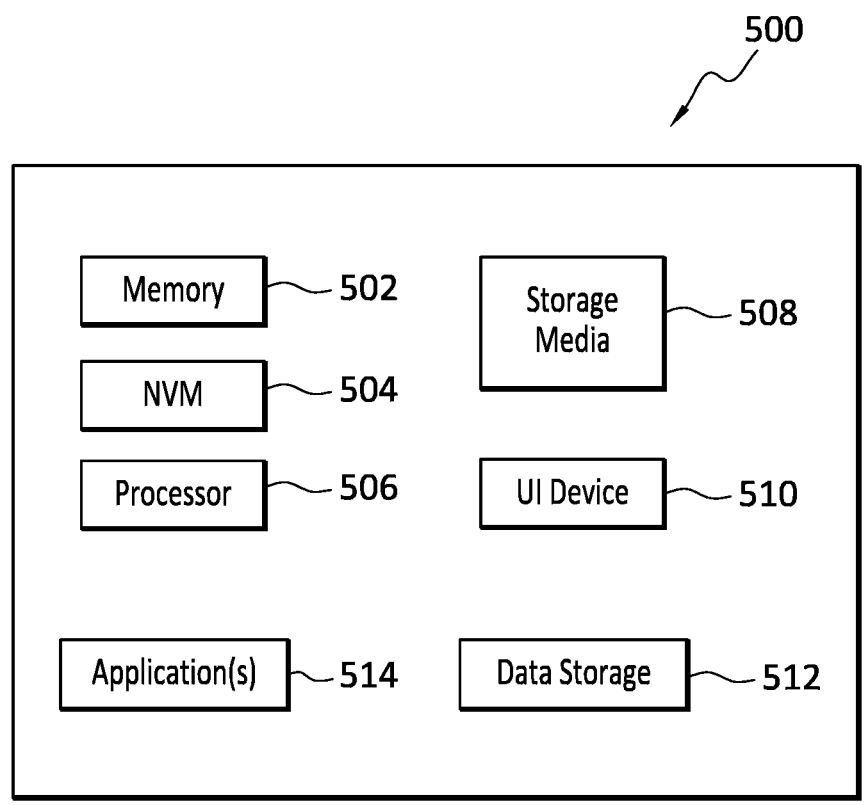
FIG. 5 discloses aspects of an example computing device.

With reference briefly now to FIG. 5, any one or more of the entities disclosed, or implied, by FIGS. 1-4 and/or elsewhere herein, may take the form of, or include, or be implemented on, or hosted by, a physical computing device, one example of which is denoted at 500. As well, where any of the aforementioned elements comprise or consist of a virtual machine (VM), that VM may constitute a virtualization of any combination of the physical components disclosed in FIG. 5.

In the example of FIG. 5, the physical computing device 500 includes a memory 502 which may include one, some, or all, of random access memory (RAM), non-volatile memory (NVM) 504 such as NVRAM for example, read-only memory (ROM), and persistent memory, one or more hardware processors 506, non-transitory storage media 508, UI device 510, and data storage 512. One or more of the memory components 502 of the physical computing device 500 may take the form of solid state device (SSD) storage. As well, one or more applications 514 may be provided that comprise instructions executable by one or more hardware processors 506 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud storage site, client, datacenter, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
intercepting an input/output request (IO) issued by an application of a virtual machine (VM), the IO including IO data and IO metadata;
storing the IO data in an IO buffer;
writing the IO metadata and a pointer, but not the IO data, to a splitter journal in memory, wherein the pointer points to the IO data in the IO buffer;
forwarding the IO to storage; and
asynchronous with operations occurring along an IO path between the application and storage, evacuating the splitter journal by sending the IO metadata and the IO data from the splitter journal to a replication site.

2. The method as recited in claim 1, wherein writing the pointer and IO metadata to the splitter journal site does not increase a latency associated with the operations between the application and storage.

3. The method as recited in claim 1, further comprising, asynchronous with operations occurring along an IO path between the application and storage, sending the IO data from the IO buffer to the replication site.

4. The method as recited in claim 1, further comprising maintaining write order fidelity of incoming IOs from the VM as the VM migrates from a first host to a second host, and maintaining write order fidelity comprises marking each incoming IO with a session number.

5. The method as recited in claim 1, further comprising receiving IOs from two different hosts as the VM migrates from one of the hosts to the other host, and maintaining write order fidelity of the IOs.

6. The method as recited in claim 1, further comprising experiencing a crash of the VM and, after restart of the VM, resuming evacuation of the splitter journal at a point where evacuation had previously ceased due to the crash of the VM.

7. The method as recited in claim 1, wherein after replication of IOs to the replication site has been suspended due to a lack of communication between the VM and the replication site, the method further comprises either:
resynchronizing a replication disk with a disk of the VM if communication between the VM and the replication site does not resume within a user-specified time period; or
if communication between the VM and the replication site resumes within the user-specified time period, recommencing splitter journal evacuation.

8. The method as recited in claim 1, wherein the memory comprises non-volatile memory (NVM).

9. The method as recited in claim 1, wherein part of the method is performed inside a hypervisor kernel.

10. The method as recited in claim 1, wherein the IO path comprises a path between the application and a splitter, and a path between the splitter and the storage.

11. A non-transitory storage medium having stored therein instructions that are executable by one or more hardware processors to perform operations comprising:
intercepting an input/output request (IO) issued by an application of a virtual machine (VM), the IO including IO data and IO metadata;
storing the IO data in an IO buffer;
writing the IO metadata and a pointer, but not the IO data, to a splitter journal in memory, wherein the pointer points to the IO data in the IO buffer;
forwarding the IO to storage; and
asynchronous with operations occurring along an IO path between the application and storage, evacuating the splitter journal by sending the IO metadata and the IO data from the splitter journal to a replication site.

12. The non-transitory storage medium as recited in claim 11, wherein writing the pointer and IO metadata to the splitter journal site does not increase a latency associated with the operations between the application and storage.

13. The non-transitory storage medium as recited in claim 11, wherein the operations further comprise, asynchronous with operations occurring along an IO path between the application and storage, sending the IO data from the IO buffer to the replication site.

14. The non-transitory storage medium as recited in claim 11, wherein the operations further comprise maintaining write order fidelity of incoming IOs from the VM as the VM migrates from a first host to a second host, and maintaining write order fidelity comprises marking each incoming IO with a session number.

15. The non-transitory storage medium as recited in claim 11, wherein the operations further comprise receiving IOs from two different hosts as the VM migrates from one of the hosts to the other host, and maintaining write order fidelity of the IOs.

16. The non-transitory storage medium as recited in claim 11, wherein the operations further comprise experiencing a crash of the VM and, after restart of the VM, resuming evacuation of the splitter journal at a point where evacuation had previously ceased due to the crash of the VM.

17. The non-transitory storage medium as recited in claim 11, wherein after replication of IOs to the replication site has been suspended due to a lack of communication between the VM and the replication site, the operations further comprise either:
resynchronizing a replication disk with a disk of the VM if communication between the VM and the replication site does not resume within a user-specified time period; or
if communication between the VM and the replication site resumes within the user-specified time period, recommencing splitter journal evacuation.

18. The non-transitory storage medium as recited in claim 11, wherein the memory comprises non-volatile memory (NVM).

19. The non-transitory storage medium as recited in claim 11, wherein one or more of the operations are performed inside a hypervisor kernel.

20. The non-transitory storage medium as recited in claim 11, wherein the IO path comprises a path between the application and a splitter, and a path between the splitter and the storage.

* * * * *